(12) United States Patent
Darabi et al.

(10) Patent No.: US 7,013,118 B2
(45) Date of Patent: Mar. 14, 2006

(54) HIGH SPEED OPERATIONAL AMPLIFIER DESIGN

(75) Inventors: Hooman Darabi, Long Beach, CA (US); Ken Evans, Pacific Palisades, CA (US)

(73) Assignee: Broadcom Corporation, Irvine, CA (US)

( * ) Notice: Subject to any disclaimer, the term of this patent is extended or adjusted under 35 U.S.C. 154(b) by 595 days.

(21) Appl. No.: 10/138,801

(22) Filed: May 3, 2002
(Under 37 CFR 1.47)

(65) Prior Publication Data

US 2003/0181184 A1    Sep. 25, 2003

Related U.S. Application Data

(60) Provisional application No. 60/367,904, filed on Mar. 25, 2002.

(51) Int. Cl.
*H04B 7/00* (2006.01)
(52) U.S. Cl. .............................. 455/240.1; 455/250.1; 375/345; 330/257
(58) Field of Classification Search .............. 330/252, 330/253, 257, 258; 375/345; 455/341, 232.1, 455/234.1, 240.1, 250.1
See application file for complete search history.

(56) References Cited

U.S. PATENT DOCUMENTS

| | | | | |
|---|---|---|---|---|
| 5,371,424 A | * | 12/1994 | Quigley et al. | 326/63 |
| 5,506,536 A | * | 4/1996 | Yeung | 327/346 |
| 6,633,191 B1 | * | 10/2003 | Hu | 327/323 |
| 6,766,148 B1 | * | 7/2004 | Mohindra | 455/73 |
| 6,807,406 B1 | * | 10/2004 | Razavi et al. | 455/313 |
| 6,812,781 B1 | * | 11/2004 | Tsuchiya | 327/563 |
| 2002/0041531 A1 | * | 4/2002 | Tanaka et al. | 365/205 |
| 2002/0075074 A1 | * | 6/2002 | Wang et al. | 330/253 |

* cited by examiner

*Primary Examiner*—Nguyen T. Vo
*Assistant Examiner*—Nhan T Le
(74) *Attorney, Agent, or Firm*—Garlick Harrison & Markison, LLP; James A. Harrison (57) ABSTRACT

A radio receiver portion of a transceiver includes a differential amplifier that is used to provide a fast response. A pair of input MOSFETs of the differential amplifier stage are coupled to an active load. A voltage follower circuit is coupled to each output stage of the two stage differential amplifier to drive a current through a load without reducing the output voltage. The voltage follower stages each include a current mirror that replicates a current level defined by an input MOSFET of the voltage follower circuit and, by its configuration, a voltage level produced by the differential amplifier to the input MOSFET of the voltage follower circuit. Accordingly, the differential amplifier stage defines the amplification of the circuit while the voltage follower circuits replicate the amplified output with the ability to drive a load.

15 Claims, 6 Drawing Sheets

HIGH SPEED OPERATIONAL AMPLIFIER DESIGN

CROSS-REFERENCE TO RELATED APPLICATION

This application claims priority to and incorporates by reference U.S. Provisional Application entitled, "Method and Apparatus for a Radio Transceiver", having a Ser. No. of 60/367,904 and a filing date of Mar. 25, 2002.

BACKGROUND

1. Field of the Invention

This invention relates generally to wireless communications and, more particularly, to the operation of a Radio Frequency (RF) transceiver within a component of a wireless communication system.

2. Description of the Related Art

The structure and operation of wireless communication systems are generally known. Examples of such wireless communication systems include cellular systems and wireless local area networks, among others. Equipment that is deployed in these communication systems is typically built to support standardized operations, i.e., operating standards. These operating standards prescribe particular carrier frequencies, modulation types, baud rates, physical layer frame structures, MAC layer operations, link layer operations, etc. By complying with these operating standards, equipment interoperability is achieved.

In a cellular system, a regulatory body typically licenses a frequency spectrum for a corresponding geographic area (service area) that is used by a licensed system operator to provide wireless service within the service area. Based upon the licensed spectrum and the operating standards employed for the service area, the system operator deploys a plurality of carrier frequencies (channels) within the frequency spectrum that support the subscribers' subscriber units within the service area. Typically, these channels are equally spaced across the licensed spectrum. The separation between adjacent carriers is defined by the operating standards and is selected to maximize the capacity supported within the licensed spectrum without excessive interference. In most cases, severe limitations are placed upon the amount of adjacent channel interference that maybe caused by transmissions on a particular channel.

In cellular systems, a plurality of base stations is distributed across the service area. Each base station services wireless communications within a respective cell. Each cell may be further subdivided into a plurality of sectors. In many cellular systems, e.g., Global System for Mobile Communications (GSM) cellular systems, each base station supports forward link communications (from the base station to subscriber units) on a first set of carrier frequencies, and reverse link communications (from subscriber units to the base station) on a second set of carrier frequencies. The first set and second set of carrier frequencies supported by the base station are a subset of all of the carriers within the licensed frequency spectrum. In most, if not all, cellular systems, carrier frequencies are reused so that interference between base stations using the same carrier frequencies is minimized and system capacity is increased. Typically, base stations using the same carrier frequencies are geographically separated so that minimal interference results.

Both base stations and subscriber units include RF transceivers. Radio frequency transceivers service the wireless links between the base stations and subscriber units. The RF transmitter receives a baseband signal from a baseband processor, converts the baseband signal to an RF signal, and couples the RF signal to an antenna for transmission. In most RF transmitters, because of well-known limitations, the baseband signal is first converted to an Intermediate Frequency (IF) signal and then the IF signal is converted to the RF signal. Similarly, the RF receiver receives an RF signal, down converts it to IF and then to baseband. In other systems, the received RF is converted directly to baseband.

Radio receivers typically include several circuits that each provides an amount of gain to the received signals. For example, mixers and low pass filters each often provide gain. Because, however, the signal strength of a received signal can vary significantly, there is a need for amplifiers within the radio receiver whose gain level is adjustable. Programmable amplifiers often vary a feedback resistance value to adjust gain. Typically, a low noise amplifier is used to amplify the received signal prior to mixing it with a local oscillator. The level of amplification provided, however, must often be adjusted to compensate for fluctuations in received signal strengths.

One problem with using a mixer and an active low pass filter, however, is that an amplifier used within a low pass filter typically comprises an Op Amp that provides a fast response but without the ability to drive current through a load. Accordingly, it is possible to provide an amplifier in a source follower configuration on the output stage of the Op Amp to drive current through the load. One problem with using a source follower configuration, however, is that the output voltage is reduced due to voltage drops from the gate to source of the source follower. This becomes a significant problem in CMOS devices because the supply voltage is typically only 3 volts DC. Thus, what is needed is a circuit that provides a fast response, can drive current through a load and does not reduce any of the output voltage potential.

SUMMARY OF THE INVENTION

Various aspects of the invention can be found in a radio receiver portion of a transceiver that includes a differential amplifier that is used in conjunction with a low pass filter so as to provides a fast response and also is able to drive a load. To drive a load, a voltage follower circuit is coupled to each output node of the differential amplifier to drive a current through a load without reducing the output voltage. Accordingly, the present invention provides an amplifier with a fast response, acceptable frequency range, and with the ability to drive a load.

More specifically, a two-stage amplifier formed in an integrated circuit includes a differential MOSFET amplifier input stage coupled to receive a signal to be amplified wherein the differential MOSFET amplifier having dual outputs for producing an amplified signal on each of the dual outputs, each of the dual outputs being coupled to a pair of dual voltage follower output stages for driving a load current. Each of the two voltage follower circuits includes a pair of matched MOSFETs, each having a commonly coupled source terminal. Additionally, the two-stage amplifier further includes an active load for providing current to bias the MOSFETs of the amplifier input stage and to keep the MOSFETs biased in an active region. The voltage follower output stage further comprises two voltage follower circuits, each coupled to receive an amplified signal output from the differential input amplifier stage.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE DRAWINGS

Figure 1A:
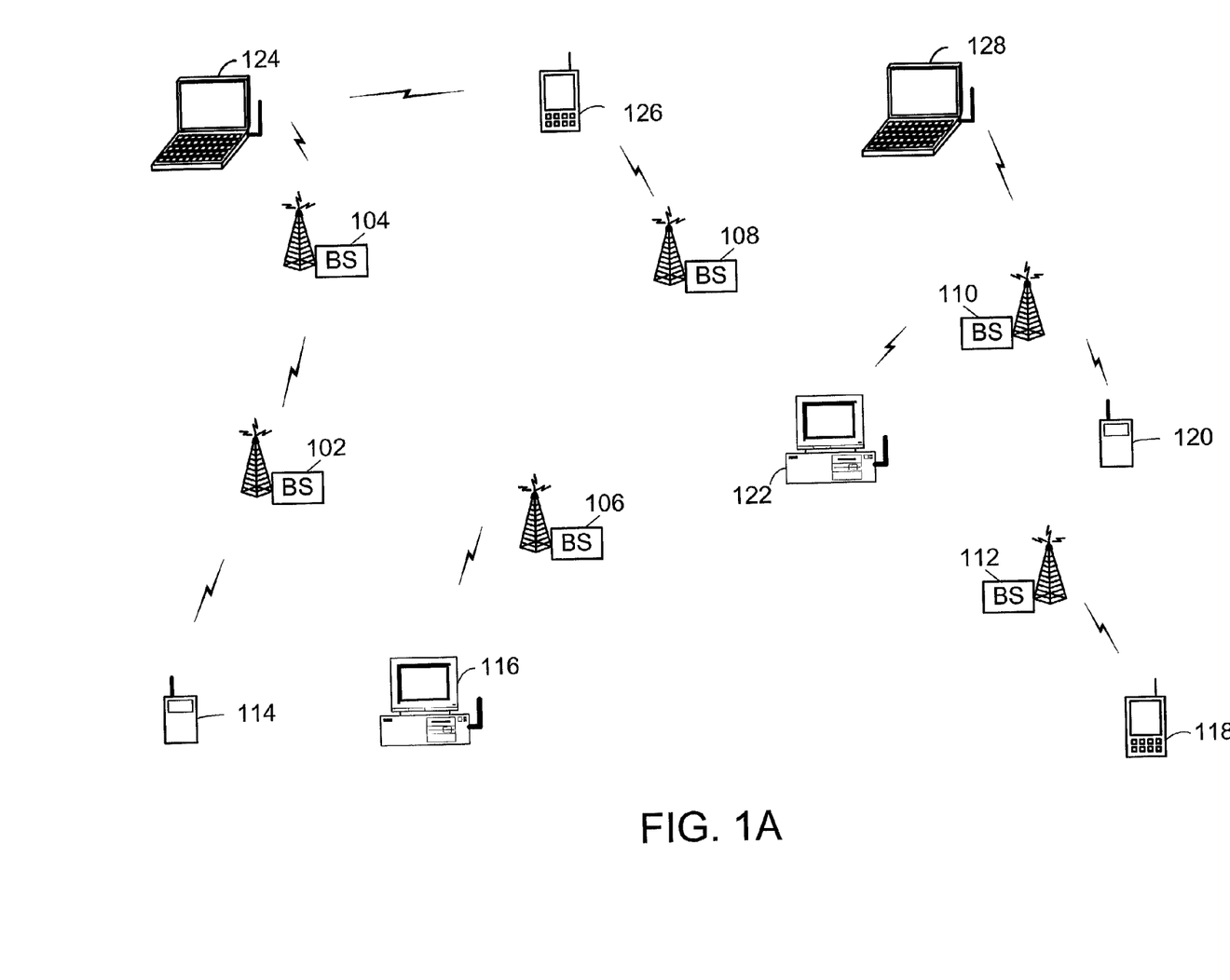
FIG. 1A is a system diagram illustrating a cellular system within which the present invention is deployed.

FIG. 1A is a system diagram illustrating a cellular system within which the present invention is deployed. The cellular system includes a plurality of base stations 102, 104, 106, 108, 110, and 112 that service wireless communications within respective cells, or sectors. The cellular system services wireless communications for a plurality of wireless subscriber units. These wireless subscriber units include wireless handsets 114, 118, 120, and 126, mobile computers 124 and 128, and desktop computers 116 and 122. During normal operations, each of these subscriber units communicates with one or more base stations during handoff among the base stations 102 through 112. Each of the subscriber units 114 through 128 and base stations 102 through 112 include RF circuitry constructed according to the present invention.

The RF circuitry formed according to the present invention may be formed to operate with any one of a number of different protocols and networks. For example, the network of FIG. 1A may be formed to be compatible with Bluetooth wireless technology that allows users to make effortless, wireless and instant connections between various communication devices such as notebook computers, desktop computers and mobile phones. Because Bluetooth systems use radio frequency transmissions to transfer both voice and data, the transmissions occur in real-time.

The Bluetooth specification provides for a sophisticated transmission mode that ensures protection from interference and provides security of the communication signals. According to most designs that implement the Bluetooth specifications, the Bluetooth radio is being built into a small microchip and is designed to operate in frequency bands that are globally available. This ensures communication compatibility on a worldwide basis. Additionally, the Bluetooth specification defines two power levels.

A first power level covers the shorter, personal area within a room and a second power level is designed for covering a medium range. For example, the second power level might be used to cover communications from one end of a building, such as a house, to the other. Software controls and identity coding are built into each microchip to ensure that only those units preset by the owners can communicate with each other. In general, it is advantageous to utilize low power transmissions and components that draw low amounts of power (especially for battery operated devices). The Bluetooth core protocols include Bluetooth-specific protocols that have been developed for Bluetooth systems. For example, the RFCOMM and TCS binary protocols have also been developed for Bluetooth but they are based on the ETSI TS 07.10 and the ITU-T recommendations Q.931 standards, respectively. Most Bluetooth devices require the Bluetooth core protocols, in addition to the Bluetooth radio, while the remaining protocols are only implemented when necessary.

The baseband and link control layers facilitate the physical operation of the Bluetooth transceiver and, more specifically, the physical RF link between Bluetooth units forming a network. As the Bluetooth standards provide for frequency-hopping in a spread spectrum environment in which packets are transmitted in continuously changing defined time slots on defined frequencies, the baseband and link control layer utilizes inquiry and paging procedures to synchronize the transmission of communication signals at the specified frequency and clock cycles between the various Bluetooth devices.

The Bluetooth core protocols further provide two different types of physical links with corresponding baseband packets. A synchronous connection-oriented (SCO) physical link and an asynchronous connectionless (ACL) physical link may be implemented in a multiplexed manner on the same RF link. ACL packets are used for data only while the SCO packets may contain audio, as well as a combination of audio and data. All audio and data packets can be provided with different levels of error correction and may also be encrypted if required. Special data types, including those for link management and control messages, are transmitted on a specified channel.

There are other protocols and types of networks being implemented and that may be used with the network of FIG. 1A. For example, wireless networks that comport with service premises-based Wireless Local Area Network (WLAN) communications, e.g., IEEE 802.11a and IEEE 802.11b communications, and ad-hoc peer-to-peer communications, e.g., Bluetooth (as described above). In a WLAN system, the structure would be similar to that shown in FIG. 1A, but, instead of base stations 102 through 112, the WLAN system would include a plurality of Wireless Access Points (WAPs). Each of these WAPs would service a corresponding area within the serviced premises and would wirelessly communicate with serviced wireless devices. For peer-to-peer communications, such as those serviced in Bluetooth applications, the RF transceiver of the present invention would support communications between peer devices, e.g., mobile computer 124 and wireless handset device 126. The fast growth of the mobile communications market and for networks as shown in FIG. 1A require the development of multi-band RF transceivers that are small in size, low in cost, and have low power consumption. These RF transceivers should be suitable for a high level of system integration on a single chip for reduced cost and miniaturized mobile device size. Low power consumption is very critical for increasing mobile device battery life, especially for mobile devices that include small batteries.

Generally, Bluetooth facilitates the fabrication of a low-cost and low-power radio chip that includes some of these protocols described herein. The Bluetooth protocol operates in the unlicensed 2.4 GHz Industrial Scientific Medical (ISM) band and, more specifically, transmits and receives on 79 different hop frequencies at a frequency in the approximate range of 2400 to 2480 MHz, switching between one hop frequency to another in a pseudo-random sequence. Bluetooth, in particular, uses GFSK modulation. Its maximum data rate is approximately 721 kbits/s and the maximum range is up to 20–30 meters.

Even though Bluetooth has a much lower range and throughput than other known systems, its consequently significantly reduced power consumption means it has the ability to be much more ubiquitous. It can be placed in printers, keyboards, and other peripheral devices, to replace short-range cables. It can also be placed in pagers, mobile phones, and temperature sensors to allow information download, monitoring and other devices equipped with a Bluetooth access point. Nonetheless, it is advantageous to improve the low power consumption of Bluetooth devices to improve battery life for portable applications.

Similarly, wireless LAN technologies (such as those formed to be compatible with IEEE 802.11b) are being designed to complement and/or replace the existing fixed-connection LANs. One reason for this is that the fixed connection LANs cannot always be implemented easily. For example, installing wire in historic buildings and old buildings with asbestos components makes the installation of LANs difficult. Moreover, the increasing mobility of the worker makes it difficult to implement hardwired systems. In response to these problems, the IEEE 802 Executive Committee established the 802.11 Working Group to create WLAN standards. The standards specify an operating frequency in the 2.4 GHz ISM band.

The first IEEE 802.11 WLAN standards provide for data rates of 1 and 2 Mbps. Subsequent standards have been designed to work with the existing 802.11 MAC layer (Medium Access Control), but at higher frequencies. IEEE 802.11a provides for a 5.2 GHz radio frequency while IEEE 802.11b provides for a 2.4 GHz radio frequency band (the same as Bluetooth). More specifically, the 802.11b protocol operates in the unlicensed 2.4 GHz ISM band. Data is transmitted on BPSK and QPSK constellations at 11 bps. 802.11b data rates include 11 Mbits/s, 5.5, 2 and 1 Mbits/s, depending on distance, noise and other factors. The range can be up to 100 m, depending on environmental conditions.

Because of the high throughput capability of 802.11b devices, a number of applications are more likely to be developed using 802.11b for networks such as that shown in FIG. 1A. These technologies will allow the user to connect to wired LANs in airports, shops, hotels, homes, and businesses in networks even though the user is not located at home or work. Once connected the user can access the Internet, send and receive email and, more generally, enjoy access to the same applications the user would attempt on a wired LAN. This shows the success in using wireless LANs to augment or even replace wired LANs.

The RF circuitry of the present invention is designed to satisfy at least some of the above mentioned standard-based protocols and may be formed in any of the subscriber units 114 through 128, base stations 102 through 112 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts) and are generally noisy. It is a challenge, therefore, to develop receive and transmission circuitry that have full functionality while meeting these lower power constraints and while providing good signal quality. The system of FIGS. 1A and 1B include the inventive phase-locked loop which provides a desired frequency signal while reducing the amount of phase noise that often are introduced into the modulated channels.

For all of these reasons, RF circuitry of the present invention is designed to satisfy at least some of the above mentioned standard-based protocols and may be formed in any of the subscriber units 114 through 128, base stations 102 through 112 or in any other wireless device, whether operating in a cellular system or not. The RF circuitry of the present invention includes low power designs that utilize CMOS technology and that support the defined protocols in a more efficient manner. Thus, for example, the teachings of the present invention may be applied to wireless local area networks, two-way radios, satellite communication devices, or other devices that support wireless communications. One challenge, however, with CMOS design in integrated circuits is that they typically utilize voltage sources having low values (e.g., 3 volts). Accordingly, it is difficult to design amplifiers that have a test response and the ability to drive a load. Thus, the inventive receivers include amplifiers whose output voltage is reproduced in a voltage follower with the ability to drive a load.

Figure 1B:
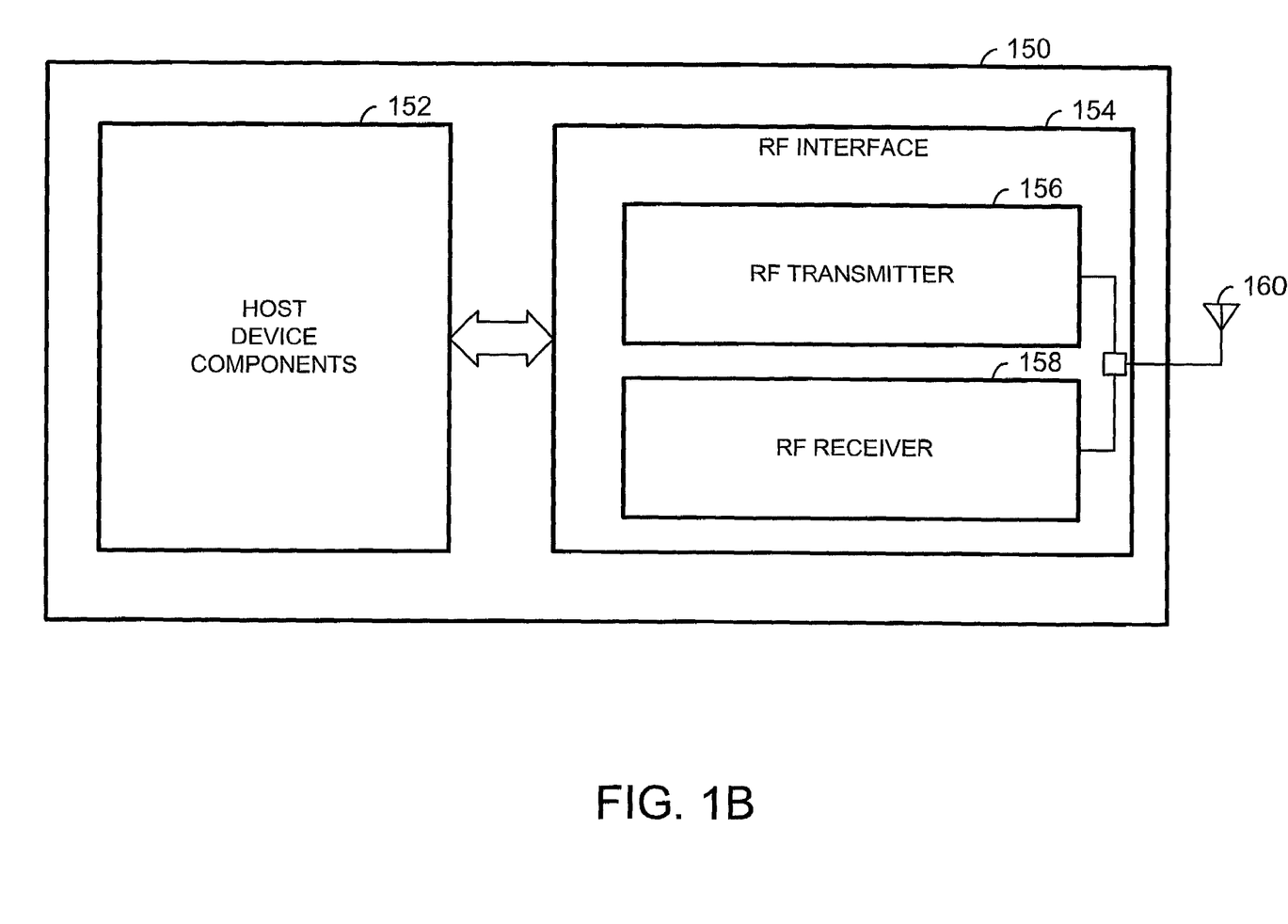
FIG. 1B is a block diagram generally illustrating the structure of a wireless device constructed according to the present invention.

FIG. 1B is a block diagram generally illustrating the structure of a wireless device 150 constructed according to the present invention. The general structure of wireless device 150 will be present in any of wireless devices 114 through 128 illustrated in FIG. 1A. Wireless device 150 includes a plurality of host device components 152 that service all requirements of wireless device 150 except for the RF requirements of wireless device 150. Of course, operations relating to the RF communications of wireless device 150 will be partially performed by host device components 152.

Coupled to host device components 152 is a Radio Frequency (RF) interface 154. RF interface 154 services the RF communications of wireless device 150 and includes an RF transmitter 156 and an RF receiver 158. RF transmitter 156 and RF receiver 158 both couple to an antenna 160. One particular structure of a wireless device is described with reference to FIG. 2. Further, the teachings of the present invention are embodied within RF transmitter 156 of RF interface 154.

The RF interface 154 may be constructed as a single integrated circuit. However, presently, the RF interface 158 includes an RF front end and a baseband processor. In the future, however, it is anticipated that many highly integrated circuits, e.g., processors, system on a chip, etc., will include an RF interface, such as the RF interface 154 illustrated in FIG. 1B. In such case, the receiver structure of the present invention described herein may be implemented in such devices.

Figure 2:
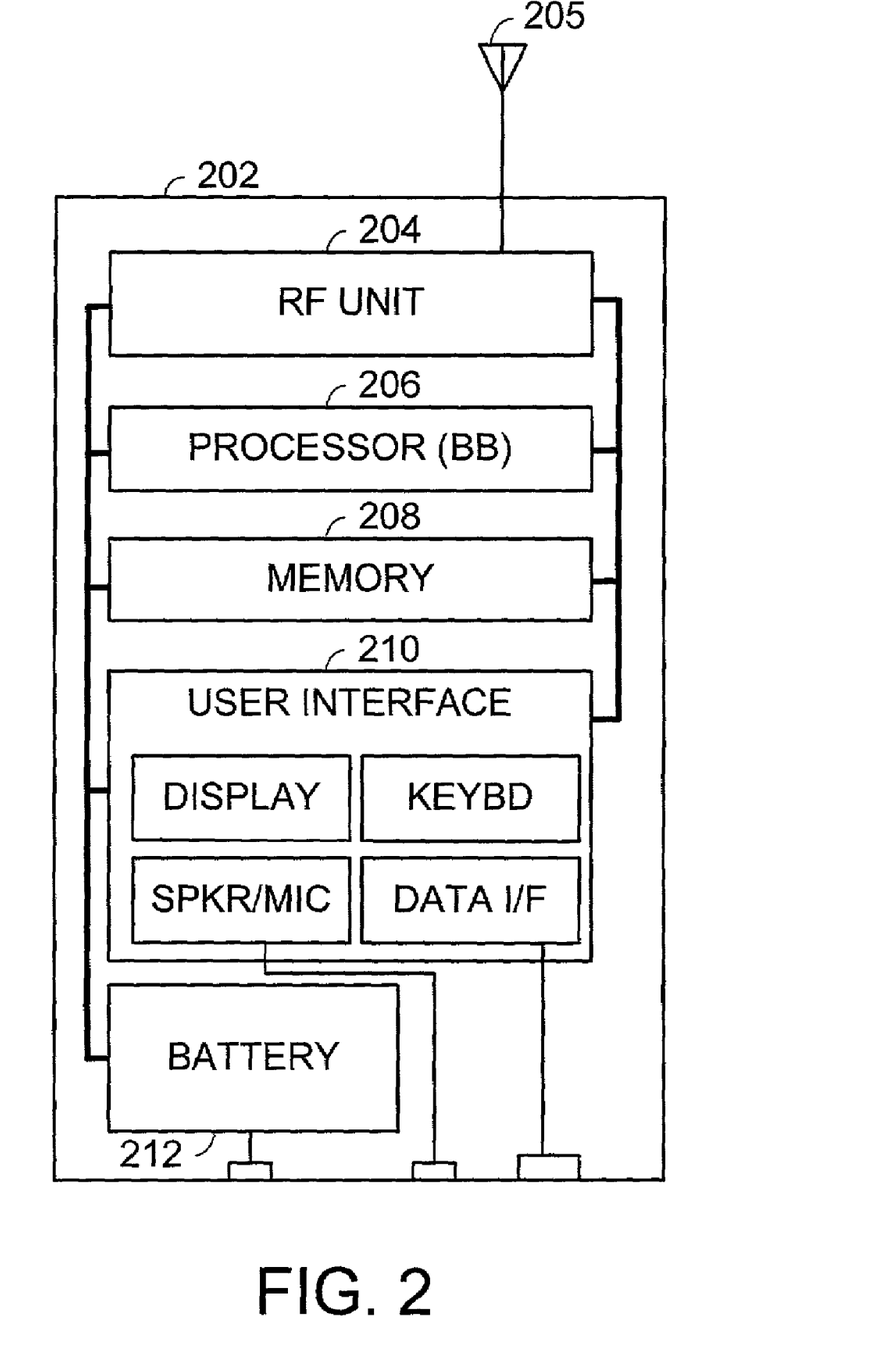
FIG. 2 is a block diagram illustrating a subscriber unit constructed according to the present invention.

FIG. 2 is a block diagram illustrating a subscriber unit 202 constructed according to the present invention. Subscriber unit 202 operates within a cellular system, such as the cellular system described with reference to FIG. 1A. Subscriber unit 202 includes an RF unit 204, a processor 206 that performs baseband processing and other processing operations, and a memory 208. RF unit 204 couples to an antenna 205 that may be located internal or external to the case of subscriber unit 202. Processor 206 may be an Application Specific Integrated Circuit (ASIC) or another type of processor that is capable of operating subscriber unit 202 according to the present invention. Memory 208 includes both static and dynamic components, e.g., Dynamic Random Access Memory (DRAM), Static Random Access Memory (SRAM), Read Only Memory (ROM), Electronically Erasable Programmable Read Only Memory (EEPROM), etc. In some embodiments, memory 208 may be partially or fully contained upon an ASIC that also includes processor 206. A user interface 210 includes a display, a keyboard, a speaker, a microphone, and a data interface, and may include other user interface components, as well. RF unit 204, processor 206, memory 208, and user interface 210 couple via one or more communication buses or links. A battery 212 is coupled to, and powers, RF unit 204, processor 206, memory 208, and user interface 210.

RF unit 204 includes the RF transceiver components and operates according to the present invention to provide fast signal response while driving a load. More specifically, RF unit 204 includes the inventive differential amplifier with a voltage follower output stage that provides a fast response but that can drive a load without any unnecessary voltage drops. The structure of subscriber unit 202, as illustrated, is only one particular example of a subscriber unit structure. Many other varied subscriber unit structures could be operated according to the teachings of the present invention. Further, the principles of the present invention may be applied to base stations, as are generally described with reference to FIG. 1A.

Figure 3:
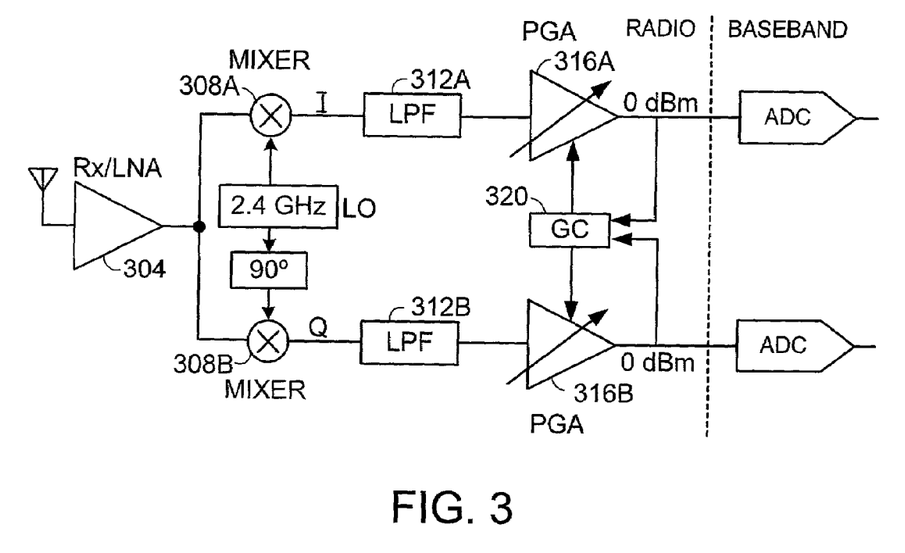
FIG. 3 is a functional schematic block diagram of an RF processing unit of a radio transceiver implemented according to one embodiment of the present invention.

FIG. 3 is a functional schematic block diagram of an RF processing unit of a radio transceiver implemented according to one embodiment of the present invention. An RF receiver unit initially receives a radio frequency signal at a receiver/low noise amplifier (LNA) 304 that is coupled to receive wireless communications by way of an antenna. As is known by those of average skill in the art, radio communications typically employ one of many different modulation techniques, including Quadrature Phase Shift Keying (QPSK). Accordingly, receiver/LNA 304 produces an amplified RF signal containing I and Q components to mixers 308A and 308B for separation into the I and Q modulated channels. The mixers 308A and 308B also down convert the received amplified RF signals from radio frequencies to baseband frequencies.

In the described embodiment of the invention, the radio transceiver is formed to satisfy 802.11b design requirements. Accordingly, the RF input signal to a low noise amplifier has a 2.4 GHz carrier frequency that is amplified, produced to the mixers 308A and 308B and then is down converted to baseband. Thereafter, mixers 308A and 308B produce the down converted signal to low pass filters 312A and 312B for the I and Q modulated channels, respectively.

As is known, low pass filters 312A and 312B are for attenuating frequency components of signals above a specified frequency. The outputs of low pass filters 312A and 312B are then produced to programmable gain amplifiers (PGAs) 316A and 316B. The outputs of PGAs 316A and 316B are adjusted by gain control circuitry 320 to produce approximately 0 dBm of gain for the amplified signal that is then transmitted into baseband processing circuitry. In the described embodiment, the analog-to-digital converters (ADCs) are within the baseband processing circuitry external to the IF radio integrated circuit.

Each of the components in this path thus far, namely, receiver/LNA 304, mixers 308A and 308B, and low pass filters 312A and 312B, add gain to the received signals. Because the gain of the received signal can vary dramatically, however, the gain of the programmable gain amplifier is adjusted so that the gain of the output signal being provided to the baseband radio circuitry is of a constant level. Unfortunately, many common programmable gain amplifiers provide a very limited number of amplification steps. Accordingly, the present invention includes a programmable gain amplifier whose gain is adjusted according to input signal strength. Additionally, the invention includes circuitry to determine an appropriate amount of gain that should be added to the signal received by the PGAs 316A and 316B so that it is amplified up to 0 dBm with a tolerance of 3 dBm.

Figure 4:
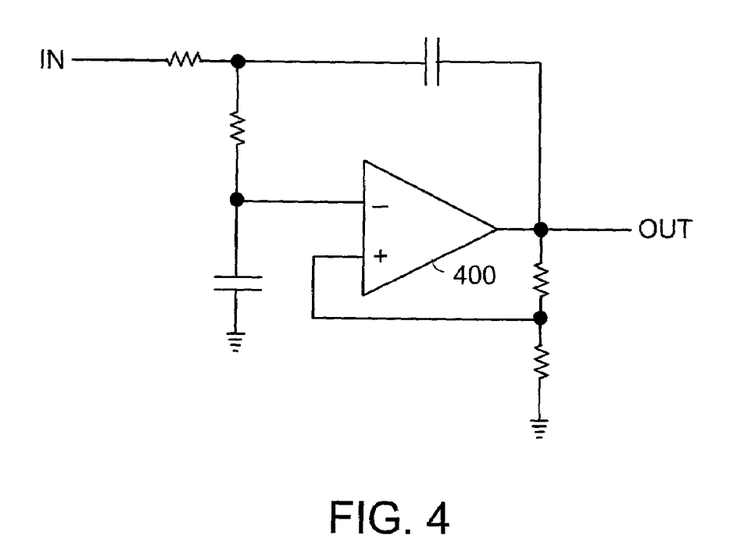
FIG. 4 is a schematic diagram of a prior art operational amplifier configured as an RC filter that provides fast response and good attenuation above a specified frequency corner.

FIG. 4 is a schematic diagram of an operational amplifier configured as an RC filter that provides fast response and good attenuation above a specified frequency corner. Modem transmitter and receiver designs require active RC filters to meet operational requirements and often incorporate active RC filters similar to the active filter shown in FIG. 4. Using active RC filters is desirable because they have a wide dynamic range compared to other filters. Active RC filters, however, require Op Amps that have high gain with resistive loads so they must have the ability to drive current into resistive loads but at the same time they must be fast enough so the filter shape is not distorted. Typically Op Amps can have high gain and drive resistive loads or be fast but usually not both. The filter configuration of FIG. 4 is known by one of average skill in the art and may readily be modified with other filter designs that include an amplifier such as amplifier 400. The filter configuration of FIG. 4 is advantageous in that it provides a sharp corner and fast response. Utilizing the inventive amplifier as amplifier 400 in conjunction with the filter circuitry shown, a filter is formed that is able to provide the desired response and also drive current through a load. It should be understood that the circuitry shown in FIG. 4 is for only one of the two outputs of the differential amplifier disclosed herein for the sake of simplicity. The circuitry, in one embodiment, is duplicated for both output stages of the differential amplifier.

Standard 802.11b requires filter corners at 8 MHz, which is high for filters that typically have high frequency corners around 100 kHz. Op Amps have bandwidth above 8 MHz but typically cannot drive resistive loads. The circuit of FIG. 4 is exemplary of prior designs that provide fast response but also that do not have the ability to drive a load. Accordingly, common designs include using Op Amp designs having two stages wherein a first stage provides the necessary gain and a second stage provides the ability to drive resistors and other loads. The problem with two stage designs, however, is that they typically are slow.

One problem, however, is that the source follower causes level shifting in the output due to the addition of an extra $V_{GS}$ drop. Present day mobile devices are battery operated which limits the maximum operating voltages to approximately 3 volts or less. Typical $V_{GS}$ values are approximately one volt, which is a severe limitation for low voltage devices so ubiquitous in today's market place.

There exits, therefore, a need in the art for a high speed Op Amp design that does not limit low voltage devices yet can drive resistive loads while maintaining a high gain-bandwidth product. The present invention addresses these problems by the inserting a voltage follower in the second stage output. The voltage follower configuration is very fast and can drive resistive loads but do not have the "extra" $V_{GS}$ drop in the output stage and, therefore, do not suffer from the voltage limitation found in other designs.

Figure 5:
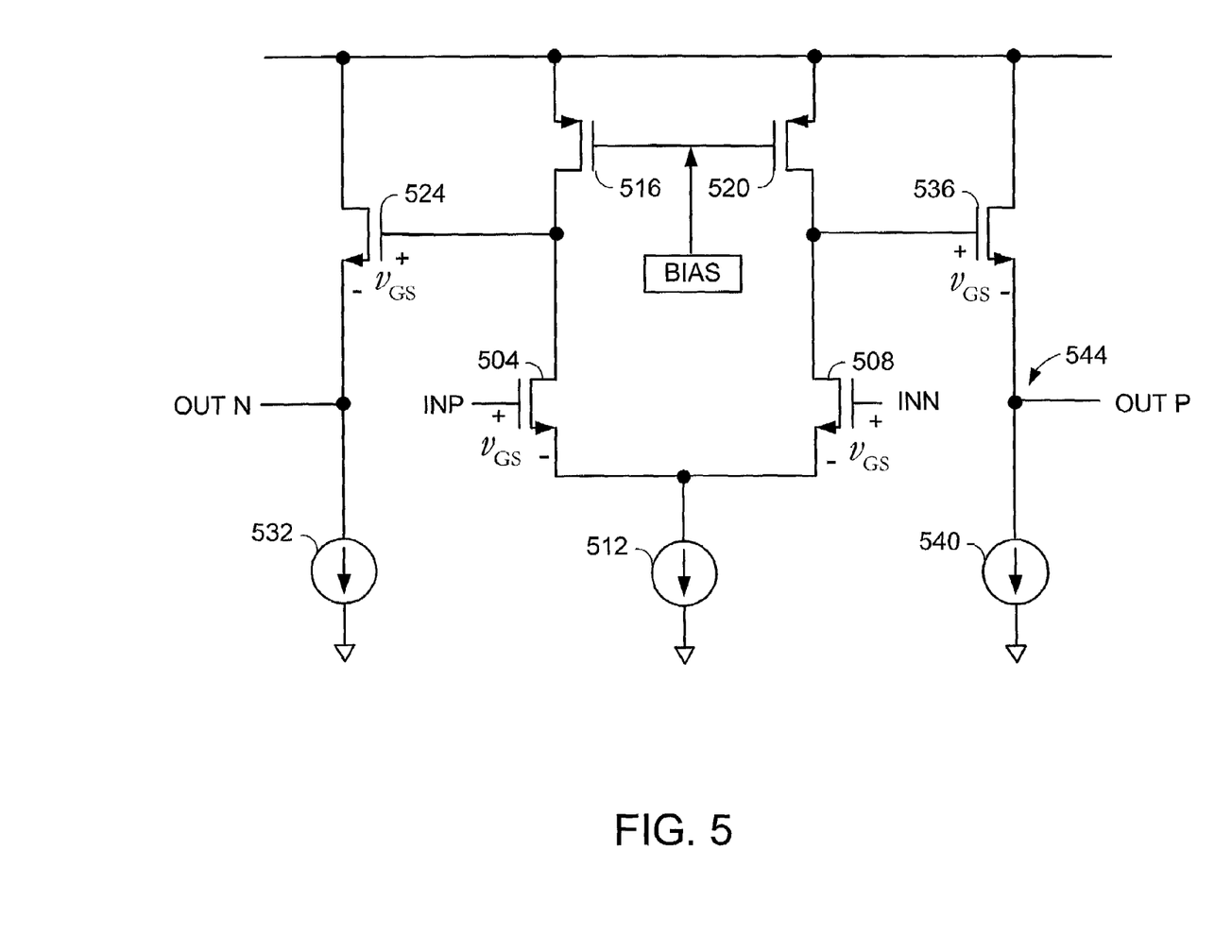
FIG. 5 is a prior art schematic diagram of a two-stage differential amplifier, wherein the second stage comprises a source follower configuration.

FIG. 5 is a schematic diagram of a two-stage differential amplifier, wherein the second stage comprises a source follower configuration. The two-stage Op Amp discussed previously can be improved by replacing the second stage with a MOSFET source follower as shown in FIG. 5. A source follower second stage does not provide any gain but it can drive resistive loads and is faster than a traditional Op Amp. Additionally, source followers have a wide bandwidth and thus do not affect the specified high frequency corners. The circuit of FIG. 5 also is advantageous in that it provides fast response while providing the ability to drive current through a load. More specifically, a differential pair of input MOSFETs 504 and 508 is coupled to receive a differential input signal. As may be seen, MOSFETs 504 and 508 are n-channel devices that are operably coupled to receive and amplify a differential signal. MOSFET 508 also is a p-channel device for conducting current and providing amplification during the alternate half of a signal cycle. The source terminals of input MOSFETs 504 and 508 are coupled to a current sink 512 that is terminated to circuit common and is for biasing the MOSFETs into their saturation region of operation.

The drain terminals of the MOSFETs 504 and 508 are coupled to at least two MOSFETs 516 and 520 that are themselves coupled and biased to provide a resistive load for each portion of a signal cycle. While not specifically shown herein FIG. 5, the source to gate voltages are set to bias the MOSFETs 516 and 520 into an active region of operation (e.g., either the linear or saturation regions of operation) to facilitate using the MOSFETs in place of a resistive load. A drain terminal of MOSFET 516 is connected to a drain terminal of input MOSFET 504. A gate terminal of an output MOSFET 524 is coupled to the drain terminal of MOSFETs 516 and 504. A drain terminal of output MOSFET 524 is coupled to a voltage source and a source terminal of output MOSFET 524 is coupled to an output node and to a current sink 532 that is also coupled to circuit common.

Similarly, MOSFET 520 has a source terminal coupled to the voltage source and a drain terminal coupled to a drain terminal of input MOSFET 508. Additionally, a gate terminal of output MOSFET 536 is coupled to the drain terminals of MOSFETs 508 and 520. The drain of output MOSFET 536 also is coupled to the voltage source while the source terminal is coupled to a current sink 540 by way of an output node shown generally at 544.

In operation, the circuit of FIG. 5 is advantageous in that it provides a fast response meaning that it provides reasonably sharp corner frequencies if the amplifier of FIG. 5 is used in a filter. Moreover, because of the source follower, the circuit of FIG. 5 is able to drive current through a load. One drawback with a solution shown in FIG. 5, however, is that the output MOSFETs 524 and 536 both have a gate to source voltage drop that is in the order of 1.0 volt or more. Accordingly, because many CMOS devices are low voltage devices with a supply voltage that is approximately equal to 3 volts D.C., losing one volt of potential across the gate to source terminals of an output MOSFET that is for driving a load is undesirable. Thus, what is needed is a fast amplifier that is able to drive current through a load and that does not reduce or limit the output potential.

Figure 6:
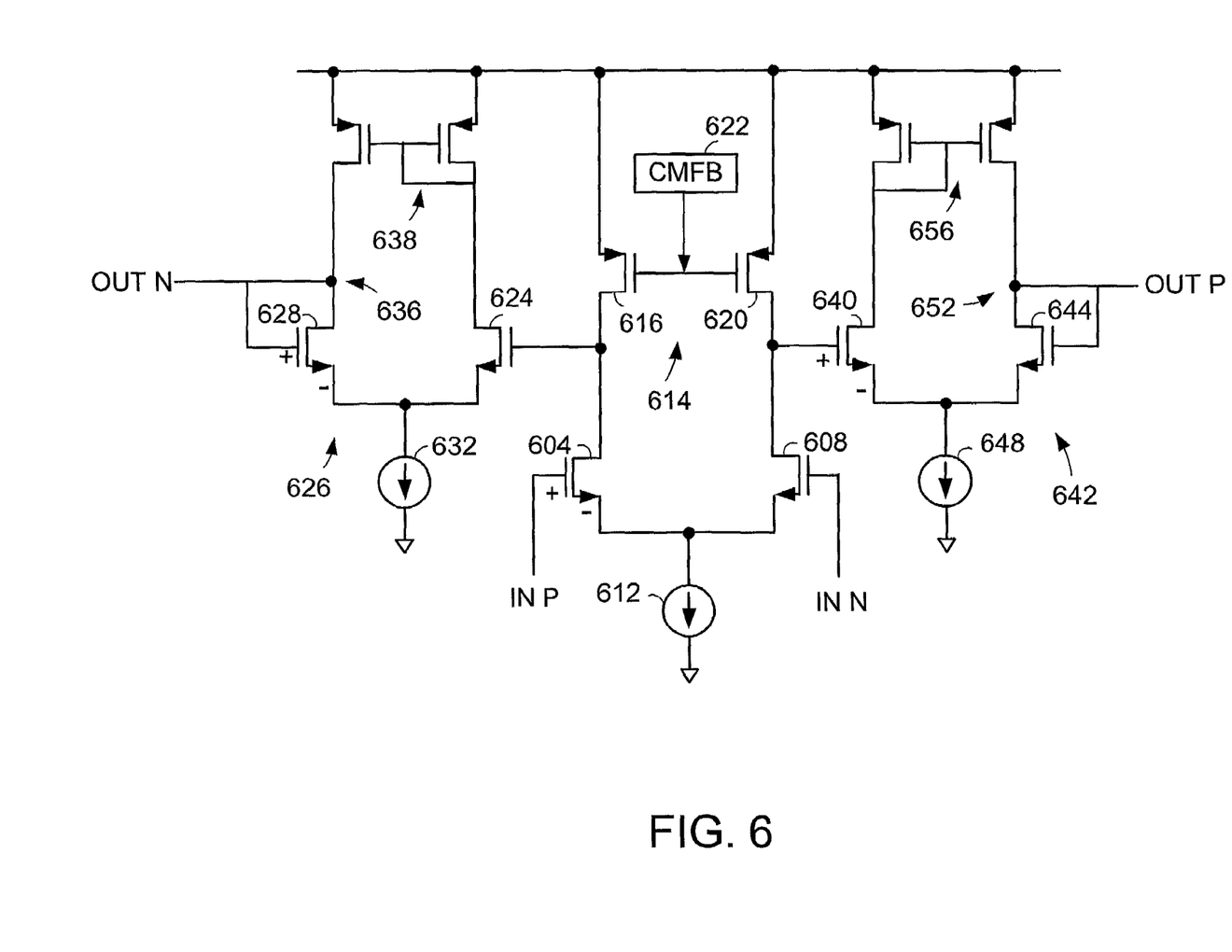
FIG. 6 is a schematic diagram of a two-stage differential amplifier formed according to one embodiment of the present invention.

FIG. 6 is a schematic diagram of a two-stage differential amplifier formed according to one embodiment of the present invention. Similar to the circuit of FIG. 5, the circuit of FIG. 6 comprises a differential amplifier pair coupled to receive an input signal and to amplify alternating portions of the signal. More specifically, an input MOSFET 604 and an input MOSFET 608 both have gate terminals coupled to receive the differential input signal, a source terminal coupled to a current sink 612 that, itself, is coupled to circuit common and a drain terminal coupled to the drain terminals of an active load shown generally at 614 comprising MOSFETs 616 and 620. The source terminals of MOSFETs 616 and 620 are coupled to a supply voltage source and the gate terminals are coupled to each other and are further biased by a common mode feedback bias circuit 622. In the described embodiment of the invention, an active load is used to bias MOSFETs 616 and 620 into an active region of operation. Typically, in discrete MOSFET amplifier design, a resistive load is used to define a bias point for a MOSFET transistor. Because resistors have a high IC real estate expense, however, it is desirable to utilize MOSFETs configured as resistors whenever possible. Using an active load serves as a good substitute for a resistive load. Additionally, using an active load increases the amount of gain of the amplifier as well.

Each set of drain terminals of MOSFETs 604 and 616 and MOSFETS 608 and 620, respectively, are coupled to a voltage follower configuration that further includes a current mirror. More specifically, the drain terminals of MOSFETs 604 and 616 are coupled to a gate terminal of a first MOSFET 624 of a first voltage follower pair shown generally at 626. A second MOSFET 628 of the first voltage follower pair 626 has a source terminal that is coupled to a source terminal of the first MOSFET 624 of the first voltage follower pair 626 and to a current sink 632 that is also coupled to circuit common. Current sink 632 is for biasing the MOSFETs of voltage follower 626 into an operational state (e.g., the saturation mode of operation). The gate terminal of second MOSFET 628 is coupled to an output node 636 that also is coupled to a drain terminal of second MOSFET 628. The drain terminals of both the first and second MOSFETs 624 and 628 of the first voltage follower pair 626 are coupled to a pair of drain terminals of a first current mirror 638 that includes MOSFETS 638A and 638B whose source terminals are coupled to the voltage source and whose gate terminals are coupled to each other as well as to the drain of MOSFET 624.

In operation, an output voltage from the differential amplifier appears across the gate to source terminals of voltage follower circuit 626. As the $V_{GS}$ of MOSFET 624 increases, the current flow through the MOSFET 624 increases and is reflected by the first current mirror 638 through MOSFET 628. Because the gate terminal of MOSFET 628 is coupled to its own drain terminal, any increased voltage at node 636 increases the $V_{GS}$ of MOSFET 628, thereby reflecting the $V_{GS}$ of MOSFET 624 that also is equal to the output of the differential amplifier. As may be seen, therefore, the output voltage is maintained by voltage follower circuit 626 that also is able to drive a load from output node 636.

Similarly, the drain terminals of MOSFETs 608 and 620 are coupled to a gate terminal of a first MOSFET 640 of a second voltage follower pair shown generally at 642. A second MOSFET 644 of the second voltage follower pair 642 has a source terminal that is coupled to a source terminal of the first MOSFET 640 of the second voltage follower pair 642 and to a current sink 648 that is also coupled to circuit common. The gate terminal of second MOSFET 644 is coupled to an output node 652 that also is coupled to a drain terminal of second MOSFET 644. The drain terminals of both the first and second MOSFETs 640 and 644 of the second voltage follower pair 642 are coupled to a pair of drain terminals of a second current mirror 656 whose source terminals are coupled to the voltage source and whose gate terminals are coupled to each other and to the drain of MOSFET 640. The operation and configuration of voltage follower 642 is similar to voltage follower 626.

With respect to the operation of the amplifier of circuit of FIG. 6, a differential input signal is received at the gate terminals of MOSFETs 604 and 608. For the sake of simplicity, the operation for a positive cycle of a signal received at the gate terminal of MOSFET 604 shall be discussed although it is understood that similar signal response occurs for the input of MOSFET 608 for the alternate cycle portion of the signal when IN "N" is positive. As a positive signal cycle is received at the gate terminal of n-channel enhancement MOSFET 604, the n-channel MOSFET 104 conducts more current thereby drawing more current through MOSFET 616 (a p-channel MOSFET) of the active load 614 thereby causing a proportionate decrease in current through MOSFET 608. Because the current through MOSFET 608 decreases, the voltage at the drain of MOSFET 608 increases proportionately due to the decreasing voltage drop across active load 620. The increase in voltage at the drain of MOSFET 608 and, therefore, the gate of MOSFET 640 results in an increase in the output voltage at node 652 because, for the voltage follower configuration shown at 642, the gate to source voltage of MOSFET 644 follows the gate to source voltage of MOSFET 640 (as described for the similar configuration of voltage follower circuit 626). Because the two MOSFETs 640 and 644 have source terminals coupled to a current sink (for bias) and drain terminals coupled to a current mirror, the gate voltage of MOSFET 644 increases as the gate voltage of MOSFET 640 increases and the output voltage increases. As may be seen, therefore, the two stage amplifier disclosed herein provides voltage follower circuits that may be used to drive a current load while also providing a fast response when required for a particular function (e.g., filtering as a part of a filter circuit).

The described embodiment of the invention assumes MOSFETs 624 and 628 as well as the MOSFETs of the current mirror 638 are matched to create a current mirror. Thus, a current that is generated through MOSFET 624 as a result of a $V_{GS}$ across the gate to source terminals is duplicated by the current mirror for conduction into node 636 where it is conducted either through MOSFET 628 or through a load. The current conducted into node 636 is equal to the current through MOSFET 624 if the devices a matched and scaled. The gate to source voltage of MOSFET 628 is equal to the gate to source voltage of MOSFET 624 under these conditions as well. In one embodiment of the invention, however, the MOSFETs are all matched but not scaled. More specifically, a fixed scaling ratio is defined in terms of channel dimensions between MOSFETs 628 and 624 and their respective MOSFETs of current mirror 638. For example, if MOSFET 628 is formed to have channel dimensions that are twice that of MOSFET 624, and the channel dimensions of the left hand MOSFET of current mirror 638 is formed to have channel dimensions that are twice that of the right hand MOSFET of current mirror 638, then the current through node 636 will be twice the current through MOSFET 624. Even in this case, however, the circuit is still a voltage follower meaning that the $V_{GS}$ of MOSFET 624 and 628 will remain equal in part because the components are matched (though not scaled). It is understood, of course, that the same level of scaling and matching should be present in the second current mirror 656 among the various MOSFETs 640, 644 and current mirror 656 thereof.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A radio receiver formed in an integrated circuit, comprising:
    a low noise amplifier (LNA) coupled to receive an RF signal from an antenna, the LNA for generating an amplified RF signal;
    a mixer coupled to receive an output from the LNA, the mixer for down converting the amplified RF signal;
    filter circuitry coupled to receive a down converted output from the mixer, the filter circuitry further including:
    a differential amplifier having an input stage further including a pair of amplification MOSFETs coupled to receive an output from the mixer, the input stage for amplifying the down converted output received from the mixer; and
    a voltage follower output stage coupled to receive an amplified output from the input stage, the voltage follower circuitry for producing an output signal that matches the amplified output of the differential amplifier to drive a load wherein the voltage follower output stage further comprises two voltage follower circuits, each coupled to receive the amplified output from the differential amplifier input stage;
    wherein each of the two voltage follower circuits includes a pair of matched MOSFETs, each having a commonly coupled source terminal; and
    second and third current sinks coupled to the commonly coupled source terminals of the pair of matched MOSFETs of each of the two voltage follower circuits, respectively.

2. The radio receiver of claim 1 further including an active load for providing current to bias the amplification MOSFETs of the input stage and to keep the amplification MOSFETs biased in an active region.

3. The radio receiver of claim 2 wherein the active load further comprises a pair of MOSFETs each having a gate terminal connected to each other and coupled to a common mode feedback bias circuit that is for providing a bias voltage for the active load.

4. The radio receiver of claim 1 further comprising a current sink coupled to receive current conducted through the differential amplifier input stage, the current sink for biasing the amplification MOSFETs of the input stage into an operational state.

5. The radio receiver of claim 1 wherein each of the two voltage follower circuits comprises a current mirror coupled between the pair of matched MOSFETs of the voltage follower circuits and a voltage source.

6. The radio receiver of claim 1 wherein the voltage follower circuits comprise at least two n-channel enhancement mode devices and at least two p-channel enhancement mode devices.

7. The radio receiver of claim 1 wherein the amplification MOSFETS of the differential amplifier input stage are n-channel devices.

8. The radio receiver of claim 1 wherein the amplification MOSFETS of the differential amplifier input stage are enhancement mode devices.

9. A two stage amplifier formed in an integrated circuit, comprising:
   a first pair of MOSFETs of a differential amplifier input stage coupled to receive a signal to be amplified, the differential amplifier having first and second outputs for producing an amplified signal on each of the first and second outputs;
   a first voltage follower output stage coupled to receive the first output of the differential amplifier for driving a load;
   a second voltage follower output stage coupled to receive an output from the second output of the differential amplifier for driving the load wherein the first and second voltage follower output stages further comprise a voltage follower circuit, coupled to receive the amplified signal from one of each of the first and second outputs of the differential amplifier input stage;
   wherein each of the two voltage follower circuits includes a pair of matched MOSFETs, each having a commonly coupled source terminal; and
   second and third current sinks coupled to the commonly coupled source terminals of the pair of matched MOSFETs of each of the two voltage follower circuits, respectively.

10. The two-stage amplifier of claim 9 further including an active load for defining a current of the differential amplifier input stage and for keeping the first pair of MOSFETs biased in an active region.

11. The two stage amplifier of claim 10 wherein the active load further comprises a second pair of MOSFETs each having a gate terminal connected to a common mode feedback bias circuit for providing a bias voltage to the gate terminals of the second pair of MOSFETS of the active load.

12. The two-stage amplifier of claim 9 wherein each of the two voltage follower circuits comprises a current mirror coupled between the pair of matched MOSFETs of the voltage follower circuits and a voltage source.

13. The two-stage amplifier of claim 9 wherein the voltage follower circuits comprise at least two n-channel enhancement mode devices and at least two p-channel enhancement mode devices.

14. The two-stage amplifier of claim 9 wherein the first pair of MOSFETS of the differential amplifier input stage are n-channel devices.

15. The two-stage amplifier of claim 9 wherein MOSFETS of the differential amplifier input stage are enhancement mode n-channel devices.

* * * * *